US012538556B2

(12) United States Patent
Lee et al.

(10) Patent No.: US 12,538,556 B2
(45) Date of Patent: Jan. 27, 2026

(54) SEMICONDUCTOR DEVICE

(71) Applicant: SAMSUNG ELECTRONICS CO., LTD., Suwon-si (KR)

(72) Inventors: Ki Heun Lee, Suwon-si (KR); Yong Seok Kim, Suwon-si (KR); Hyun Cheol Kim, Suwon-si (KR); Dae Won Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 511 days.

(21) Appl. No.: 18/182,426

(22) Filed: Mar. 13, 2023

(65) Prior Publication Data

US 2024/0047550 A1   Feb. 8, 2024

(30) Foreign Application Priority Data

Aug. 4, 2022   (KR) .................. 10-2022-0097209

(51) Int. Cl.
*H10D 64/68*    (2025.01)
*H10D 30/69*    (2025.01)
*H10D 64/23*    (2025.01)

(52) U.S. Cl.
CPC ......... *H10D 64/689* (2025.01); *H10D 30/701* (2025.01); *H10D 64/251* (2025.01)

(58) Field of Classification Search
None
See application file for complete search history.

(56) References Cited

U.S. PATENT DOCUMENTS

| 10,211,312 | B2 | 2/2019 | Van Houdt et al. | |
|---|---|---|---|---|
| 10,937,885 | B2 | 3/2021 | Heo et al. | |
| 2011/0114918 | A1* | 5/2011 | Lin | H10D 30/472 |
| | | | | 257/29 |
| 2011/0163298 | A1* | 7/2011 | Sung | H10D 62/882 |
| | | | | 257/29 |
| 2017/0040331 | A1* | 2/2017 | Van Houdt | H10D 30/701 |
| 2018/0358470 | A1* | 12/2018 | Lee | G11C 13/025 |
| 2020/0176610 | A1 | 6/2020 | Lee et al. | |
| 2020/0194591 | A1 | 6/2020 | Kim et al. | |
| 2021/0217952 | A1* | 7/2021 | Jarillo-Herrero | |
| | | | | H10N 70/8825 |
| 2021/0280720 | A1 | 9/2021 | Lee et al. | |
| 2021/0359101 | A1 | 11/2021 | Heo et al. | |

FOREIGN PATENT DOCUMENTS

CN        104617135        5/2015

* cited by examiner

*Primary Examiner* — Xiaoming Liu
(74) *Attorney, Agent, or Firm* — MORGAN, LEWIS & BOCKIUS LLP

(57) ABSTRACT

Provided are semiconductor devices. The semiconductor device includes a substrate, a gate structure disposed on the substrate and extending in a first direction, and an active pattern spaced apart from the substrate in a second direction, extending in a third direction, and penetrating the gate structure, wherein the active pattern includes a two-dimensional material, the gate structure comprises a gate insulating layer, a lower gate conductive layer, a ferroelectric layer, and an upper gate conductive layer, which are sequentially stacked on the active pattern, the gate insulating layer includes hexagonal boron nitride (h-BN), and the ferroelectric layer includes a bilayer of a two-dimensional material.

20 Claims, 19 Drawing Sheets

SEMICONDUCTOR DEVICE

CROSS-REFERENCE TO RELATED APPLICATION

This application claims priority from Korean Patent Application No. 10-2022-0097209 filed on Aug. 4, 2022 in the Korean Intellectual Property Office, and all the benefits accruing therefrom under 35 U.S.C. 119, the contents of which in its entirety are herein incorporated by reference.

TECHNICAL FIELD

The present disclosure relates to a semiconductor device, and more particularly, to a semiconductor device including ferroelectrics.

DISCUSSION OF RELATED ART

Ferroelectrics are materials having the property of spontaneous polarization by aligning the internal electric dipole moments even when no electric field is applied from the outside. In addition, the polarization of ferroelectrics may be changed by applying an external electric field greater than or equal to a coercive field, such that the electrical polarization is reversible. Such a polarization state can be electrically read through changes within an adjacent material, such as a metal, a semiconductor, or the like. Thus, research has been conducted to improve the performance of semiconductor devices by applying these ferroelectric properties to the semiconductor devices.

SUMMARY

Aspects of the present disclosure provide a semiconductor device including a ferroelectric layer made of a two-dimensional material.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a substrate, a gate structure disposed on the substrate and extending in a first direction, and an active pattern spaced apart from the substrate in a second direction, extending in a third direction, and penetrating the gate structure, wherein the active pattern includes a two-dimensional material, the gate structure comprises a gate insulating layer, a lower gate conductive layer, a ferroelectric layer, and an upper gate conductive layer, which are sequentially stacked on the active pattern, the gate insulating layer includes hexagonal boron nitride (h-BN), and the ferroelectric layer includes a bilayer of a two-dimensional material.

According to another aspect of the present disclosure, there is provided a semiconductor device comprising a channel layer disposed on a substrate and including a two-dimensional material, a gate structure disposed on the channel layer, and source/drain contacts disposed on both sides of the gate structure and electrically connected to the channel layer, wherein the gate structure comprises a gate insulating layer including hexagonal boron nitride (h-BN), a lower gate graphene layer disposed on the gate insulating layer and including graphene, a ferroelectric layer disposed on the lower gate graphene layer and including a bilayer of a two-dimensional material, and an upper gate graphene layer disposed on the ferroelectric layer and including graphene.

According to still another aspect of the present disclosure, there is provided a semiconductor device comprising a substrate, a gate structure disposed on the substrate and extending in a first direction, a first active pattern spaced apart from the substrate in a second direction, extending in a third direction, and penetrating the gate structure, a second active pattern disposed on the first active pattern, spaced apart from the first active pattern in the second direction, extending in the third direction, and penetrating the gate structure, a length of the second active pattern in the third direction being smaller than a length of the first active pattern in the third direction, a first source/drain contact electrically connected to the first active pattern and not electrically connected to the second active pattern, and a second source/drain contact electrically connected to the second active pattern and not electrically connected to the first active pattern, wherein the first active pattern and the second active pattern include a two-dimensional material, the gate structure comprises a gate insulating layer extending along a circumference of the first active pattern and a circumference of the second active pattern and including hexagonal boron nitride(h-BN), a lower gate graphene layer disposed on the gate insulating layer, extending along the circumference of the first active pattern and the circumference of the second active pattern, and including graphene, a ferroelectric layer disposed on the lower gate graphene layer, extending along the circumference of the first active pattern and the circumference of the second active pattern, and including a bilayer of a two-dimensional material, an upper gate conductive layer disposed on the ferroelectric layer and extending along the circumference of the first active pattern and the circumference of the second active pattern, and a filling gate conductive layer disposed on the upper gate conductive layer.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Hereinafter, a semiconductor device according to various embodiments will be described with reference to FIGS. 1 to 8.

Figure 1:
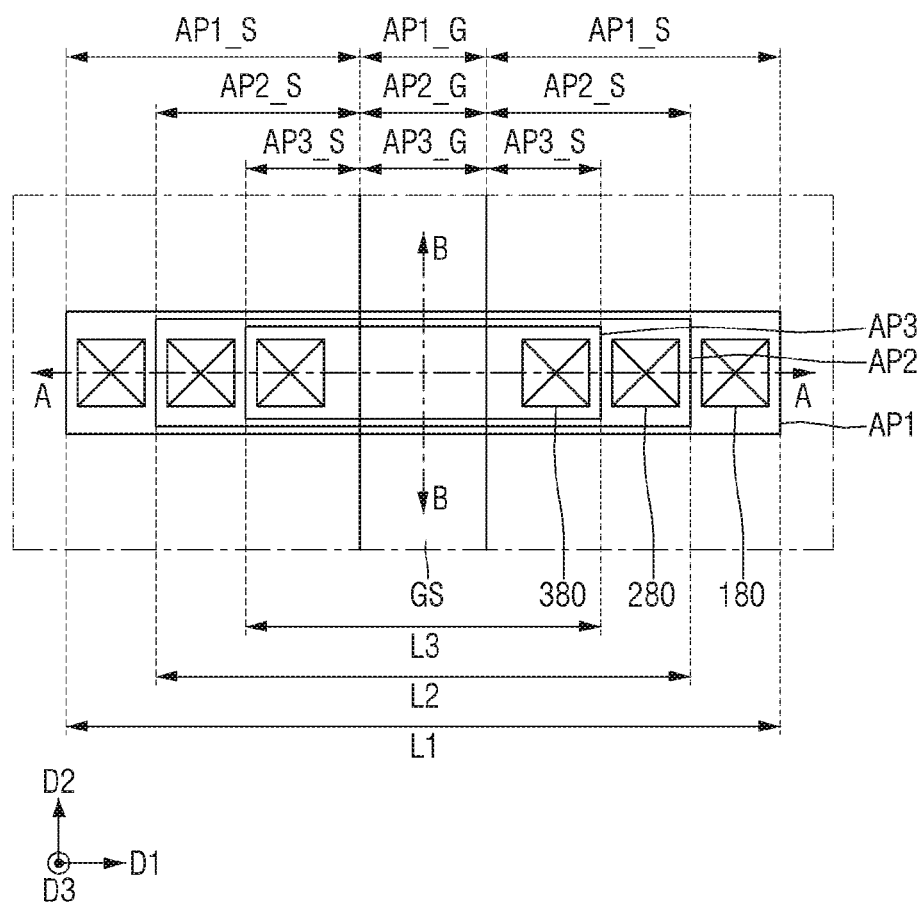
FIG. 1 is a layout diagram for describing a semiconductor device according to an embodiment of the present inventive concept.
Figure 2:
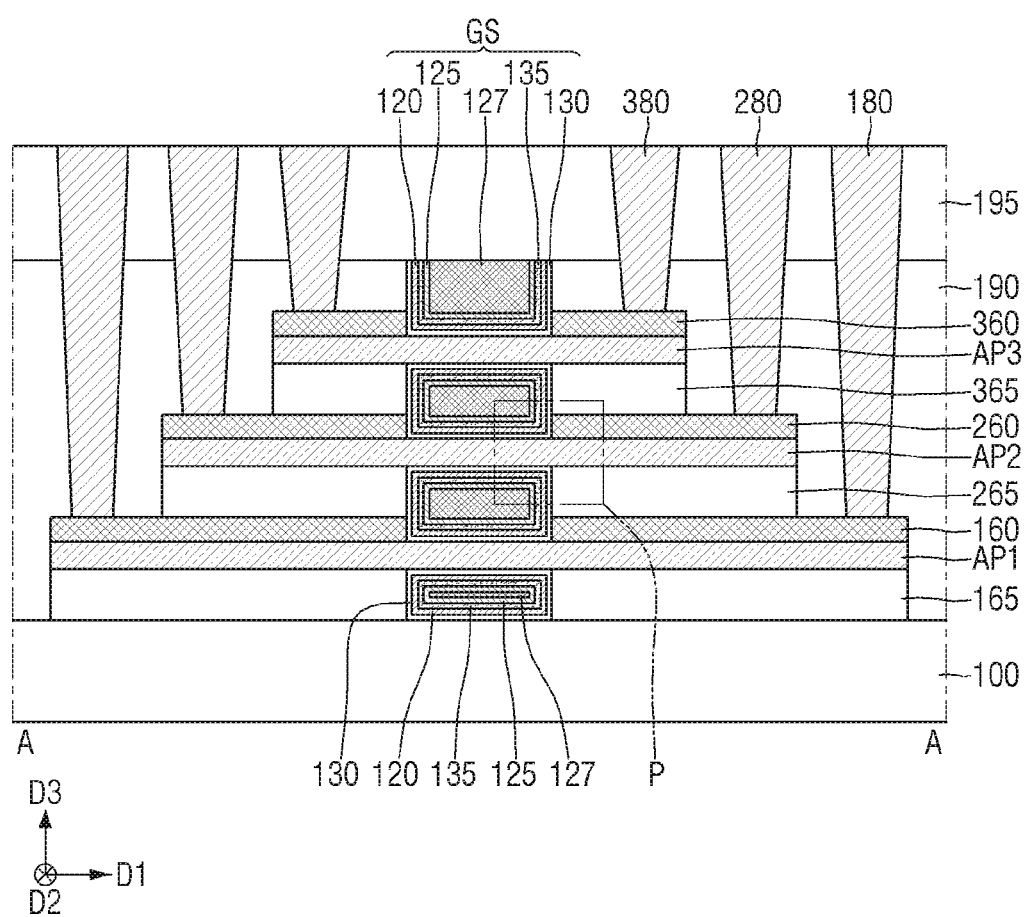
FIGS. 2 and 3 are cross-sectional views respectively taken along lines A-A and B-B of FIG. 1, according to an embodiment of the present inventive concept.
Figure 3:
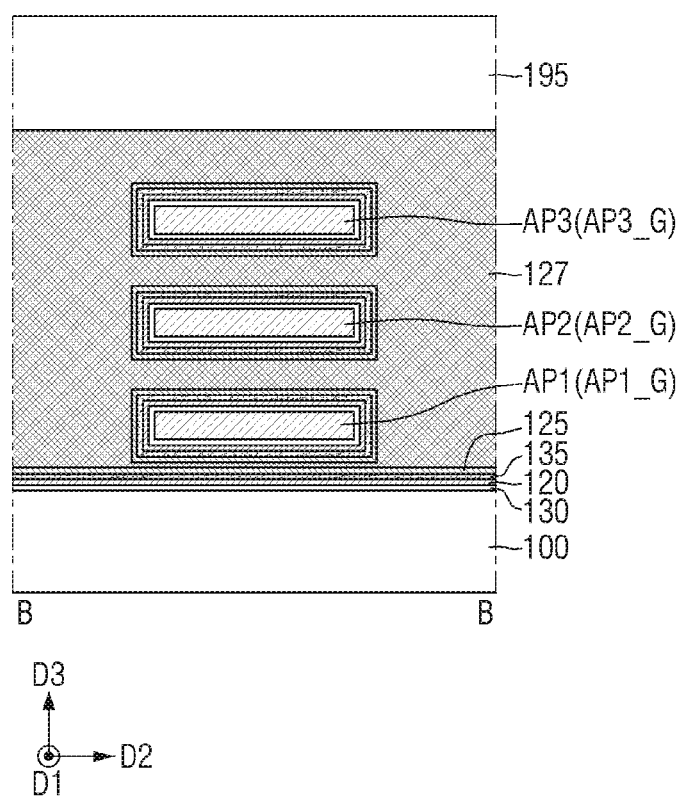
Figure 4:
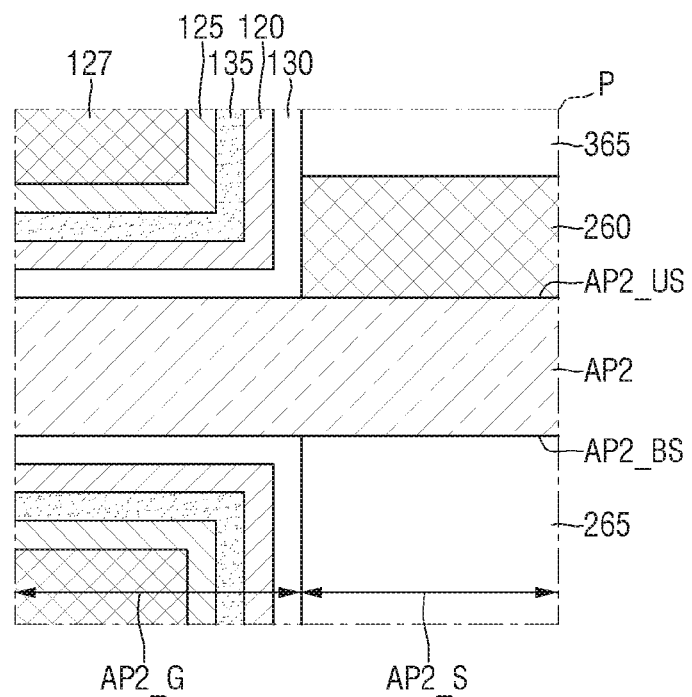
FIG. 4 is an enlarged view of portion P of FIG. 2, according to an embodiment of the present inventive concept.
Figure 5:
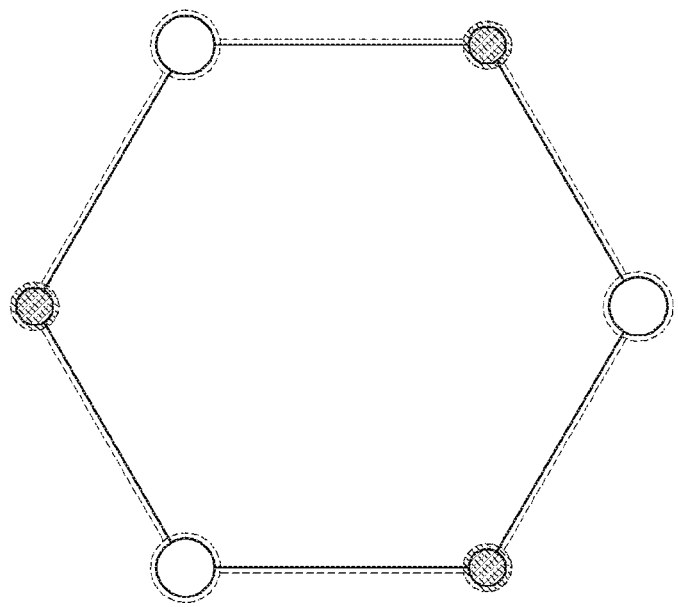
FIGS. 5 and 6 are diagrams for describing a laminate structure of a gate insulating film of FIG. 2, according to an embodiment of the present inventive concept.
Figure 6:
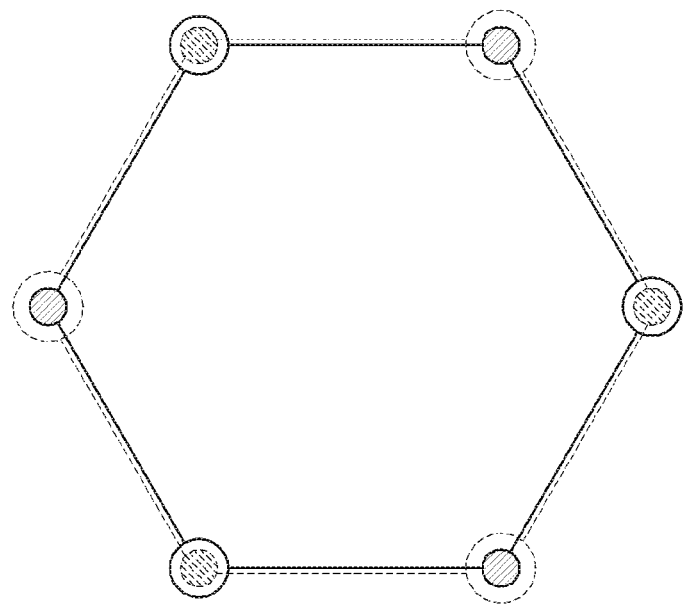
Figure 7:
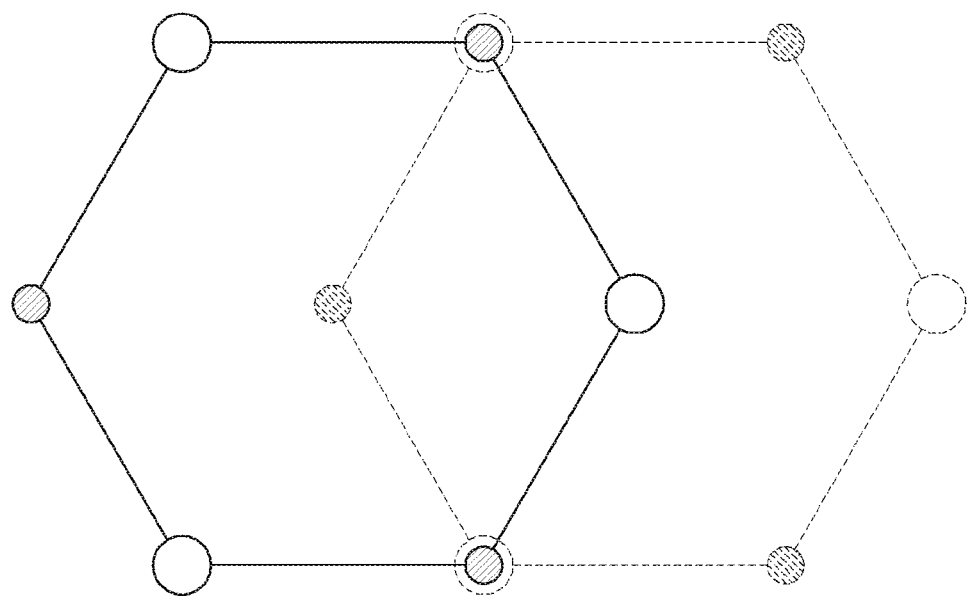
FIGS. 7 and 8 are diagrams for describing a laminate structure of a ferroelectric layer of FIG. 2, according to an embodiment of the present inventive concept.
Figure 8:
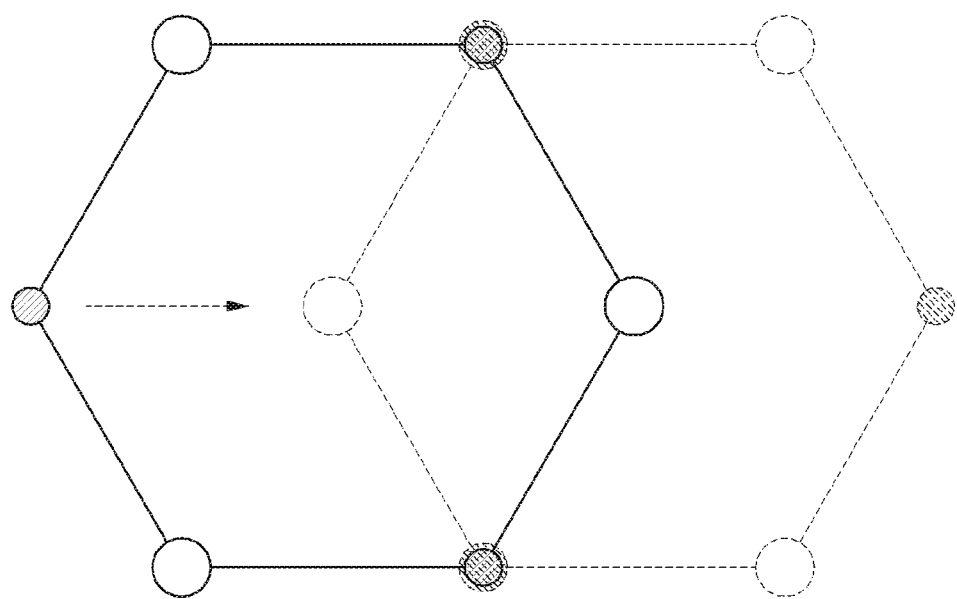

FIG. 1 is a layout diagram for describing a semiconductor device, according to an embodiment of the present inventive concept. FIGS. 2 and 3 are cross-sectional views respectively taken along lines A-A and B-B of FIG. 1. FIG. 4 is an enlarged view of portion P of FIG. 2. FIGS. 5 and 6 are diagrams for describing a laminate structure of a gate insulating film of FIG. 2. FIGS. 7 and 8 are diagrams for describing a laminate structure of a ferroelectric layer of FIG. 2.

Referring to FIGS. 1 to 8, a semiconductor device, according to an embodiment of the present inventive concept, may include a plurality of active patterns AP1, AP2, and AP3, a gate structure GS, a plurality of source/drain electrodes 160, 260, and 360, and a plurality of source/drain contacts 180, 280, and 380.

The first active pattern AP1 may include a channel portion AP1_G and a source/drain portion AP1_S. The source/drain portion AP1_S of the first active pattern may protrude from the channel portion AP1_G of the first active pattern in the first direction D1. The source/drain portion AP1_S of the first active pattern may be disposed on each side of the channel portion AP1_G of the first active pattern.

The second active pattern AP2 may include a channel portion AP2_G and a source/drain portion AP2_S. The source/drain portion AP2_S of the second active pattern may protrude from the channel portion AP2_G of the second active pattern in the first direction D1. The source/drain portion AP2_S of the second active pattern may be disposed on each side of the channel portion AP2_G of the second active pattern.

The third active pattern AP3 may include a channel portion AP3_G and a source/drain portion AP3_S. The source/drain portion AP3_S of the third active pattern may protrude from the channel portion AP3_G of the third active pattern in the first direction D1. The source/drain portion AP3_S of the third active pattern may be disposed on each side of the channel portion AP3_G of the third active pattern.

A length L1 of the first active pattern AP1 in the first direction D1 can be greater than a length L2 of the second active pattern AP2 in the first direction D1. The length L2 of the second active pattern AP2 in the first direction D1 can be greater than a length L3 of the third active pattern AP3 in the first direction D1.

FIGS. 2 and 3 are cross-sectional views respectively taken along lines A-A and B-B of FIG. 1, according to an embodiment of the present inventive concept.

A substrate 100 may be a bulk silicon substrate or a silicon-on-insulator (SOI) substrate. Alternatively, the substrate 100 may be a silicon substrate, or may include, for example, silicon germanium, silicon germanium on insulator (SGOI), indium antimonide, lead tellurium compound, indium arsenide, indium phosphide, gallium arsenide, or gallium antimonide, but the present disclosure is not limited thereto.

The active patterns AP1, AP2, and AP3 are disposed on the substrate 100. The active patterns AP1, AP2, and AP3 may be spaced apart from the substrate 100 in a third direction D3.

The first active pattern AP1, the second active pattern AP2, and the third active pattern AP3 may be sequentially disposed on the substrate 100. The first active pattern AP1, the second active pattern AP2, and the third active pattern AP3 may be elongated along a first direction D1.

The first active pattern AP1 may be disposed on the substrate 100. The first active pattern AP1 may be spaced apart from the substrate 100 in the third direction D3. The first active pattern AP1 may be separated from the substrate 100 by a first channel separation insulating layer 165.

The second active pattern AP2 may be disposed on the first active pattern AP1. The second active pattern AP2 may be spaced apart from the first active pattern AP1 in the third direction D3. The second active pattern AP2 may be separated from the first active pattern AP1 by a second channel separation insulating layer 265.

The third active pattern AP3 may be disposed on the second active pattern AP2. The third active pattern AP3 may be spaced apart from the second active pattern AP2 in the third direction D3. The third active pattern AP3 may be separated from the second active pattern AP2 by a third channel separation insulating layer 365.

In various embodiments, the length of the active patterns AP1, AP2, and AP3 sequentially disposed on the substrate 100 decrease as their distance from the substrate 100 increases.

In various embodiments, the length of the source/drain portion AP2_S of the second active pattern is greater than the length of the source/drain portion AP3_S of the third active pattern and smaller than the source/drain portion AP1_S of the first active pattern. When viewed in a cross-sectional view, the first active pattern AP1, the second active pattern AP2, and the third active pattern AP3 may be stacked in a staircase shape on the substrate 100.

In various embodiments, the channel portion AP2_G of the second active pattern overlaps the channel portion AP1_G of the first active pattern and the channel portion AP3_G of the third active pattern in the third direction D3, as shown, for example, in FIGS. 3 and 1.

The first active pattern AP1, the second active pattern AP2, and the third active pattern AP3 may be a channel pattern used as a channel region of a transistor.

The first active pattern AP1, the second active pattern AP2, and the third active pattern AP3 may include a two-dimensional semiconductor material. For example, each of the first active pattern AP1, the second active pattern AP2, and the third active pattern AP3 may be a channel pattern made of a two-dimensional semiconductor material.

In various embodiments, the first active pattern AP1, the second active pattern AP2, and the third active pattern AP3 may include, for example, a transition metal dichalcogenide (TMD) material. The first active pattern AP1, the second active pattern AP2, and the third active pattern AP3 may include at least one of, for example, $MoS_2$, $MoSe_2$, $MoTe_2$, $WS_2$, $WSe_2$, or, $WTe_2$, but the present disclosure is not limited thereto.

In a non-limiting example, the first active pattern AP1, the second active pattern AP2, and the third active pattern AP3 may include the same material. In another non-limiting example, the first active pattern AP1, the second active pattern AP2, and the third active pattern AP3 may include different materials from one another. In another non-limiting example, a material included in some of the first active pattern AP1, the second active pattern AP2, and the third active pattern AP3 may be different from a material included in other patterns. In the semiconductor device according to various embodiments, the first active pattern AP2, the second active pattern AP2, and the third active pattern AP3 may include $MoS_2$.

Although three active patterns AP1, AP2, and AP3 are illustrated as being disposed on the substrate 100, the present disclosure is not limited thereto. Different from the drawings, one or two active patterns may be disposed on the substrate 100. Alternatively, four or more active patterns may be disposed on the substrate 100.

A first channel separation insulating layer 165 may be disposed between the substrate 100 and the first active pattern AP1. The first channel separation insulating layer 165 may overlap the source/drain portion AP1_S of the first active pattern in the third direction D3. The first channel separation insulating layer 165 may not overlap the channel portion AP1_G of the first active pattern in the third direction D3.

The first channel separation insulating layer 165 may be in contact with the first active pattern AP1. The first channel separation insulating layer 165 may be in contact with the source/drain portion AP1_S of the first active pattern.

A second channel separation insulating layer 265 may be disposed between the first active pattern AP1 and the second active pattern AP2. The second channel separation insulating layer 265 may overlap the source/drain portion AP2_S of the second active pattern in the third direction D3. The second channel separation insulating layer 265 may not overlap the channel portion AP2_G of the second active pattern in the third direction D3.

The second channel separation insulating layer 265 may be in contact with the second active pattern AP2. The second channel separation insulating layer 265 may be in contact with the source/drain portion AP2_S of the second active pattern.

A third channel separation insulating layer 365 may be disposed between the second active pattern AP2 and the third active pattern AP3. The third channel separation insulating layer 365 may overlap the source/drain portion AP3_S of the third active pattern in the third direction D3. The third channel separation insulating layer 365 may not overlap the channel portion AP3_G of the third active pattern in the third direction D3.

The third channel separation insulating layer 365 may be in contact with the third active pattern AP3. The third channel separation insulating layer 365 may be in contact with the source/drain portion AP3_S of the third active pattern.

The channel separation insulating layers 165, 265, and 365 may include, for example, an insulating material. The channel separation insulating layers 165, 265, and 365 may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or a combination thereof.

The gate structure GS may be disposed on the substrate 100. The gate structure GS can extend in a second direction D2.

In various embodiments, the first active pattern AP1, the second active pattern AP2, and the third active pattern AP3 intersects the gate structure GS. Each of the first active pattern AP1, the second active pattern AP2, and the third active pattern AP3 can penetrate the gate structure GS.

In various embodiments, the gate structure GS overlaps the channel portion AP1_G of the first active pattern, the channel portion AP2_G of the second active pattern, and the channel portion AP3_G of the third active pattern in the third direction D3. The gate structure GS may enclose the channel portion AP1_G of the first active pattern, the channel portion AP2_G of the second active pattern, and the channel portion AP3_G of the third active pattern.

In various embodiments, the source/drain portion AP1_S of the first active pattern, the source/drain portion AP2_S of the second active pattern, and the source/drain portion AP3_S of the third active pattern do not overlap the gate structure GS in the third direction D3. The source/drain portion AP1_S of the first active pattern, the source/drain portion AP2_S of the second active pattern, and the source/drain portion AP3_S of the third active pattern may protrude in the first direction D1 from a sidewall of the gate structure GS.

In various embodiments, the gate structure GS may include a gate insulating layer 130, a lower gate conductive layer 120, a ferroelectric layer 135, an upper gate conductive layer 125, and a filling gate conductive layer 127, which are sequentially stacked on the active patterns AP1, AP2, and AP3.

In various embodiments, the gate insulating layer 130 is disposed on the first active pattern AP1, the second active pattern AP2, and the third active pattern AP3. The gate insulating layer 130 may extend along the circumference of the first active pattern AP1, the circumference of the second active pattern AP2, the circumference of the third active pattern AP3, and an upper surface of the substrate 100, where the first active pattern AP1, the second active pattern AP2, and the third active pattern AP3 can penetrate the gate structure GS.

In various embodiments, the gate insulating layer 130 may be in contact with the first active pattern AP1, the second active pattern AP2, and the third active pattern AP3. The gate insulating layer 130 may be in contact with the channel portion AP1_G of the first active pattern, the channel portion AP2_G of the second active pattern, and the channel portion AP3_G of the third active pattern.

In various embodiments, the gate insulating layer 130 may extend along a sidewall of the first channel separation insulating layer 165, a sidewall of the second channel separation insulating layer 265, and a sidewall of the third channel separation insulating layer 365. The gate insulating layer 130 may be in contact with the first channel separation insulating layer 165, the second channel separation insulating layer 265, and the third channel separation insulating layer 365.

In various embodiments, the gate insulating layer 130 may include, for example, a two-dimensional material. The gate insulating layer 130 may include, for example, hexagonal boron nitride (h-BN). In the semiconductor device according to various embodiments, the gate insulating layer 130 may be a h-BN layer.

In various embodiments, the lower gate conductive layer 120 is disposed on the gate insulating layer 130. The lower gate conductive layer 120 may extend along the circumference of the first active pattern AP1, the circumference of the second active pattern AP2, the circumference of the third active pattern AP3, and the upper surface of the substrate 100.

In various embodiments, the lower gate conductive layer 120 may include, for example, a two-dimensional material. The lower gate conductive layer 120 may include, for example, graphene. In the semiconductor device according to various embodiments, the lower gate conductive layer 120 may be a graphene layer, where the lower gate conductive layer 120 can be a lower gate graphene layer.

In various embodiments, the ferroelectric layer 135 may be disposed on the lower gate conductive layer 120. The ferroelectric layer 135 may extend along the circumference of the first active pattern AP1, the circumference of the second active pattern AP2, the circumference of the third active pattern AP3, and the upper surface of the substrate 100.

In various embodiments, the ferroelectric layer 135 may include, for example, a two-dimensional material. The ferroelectric layer 135 may be formed as a bilayer. The ferroelectric layer 135 may include a bilayer of a two-dimensional material.

In various embodiments, the ferroelectric layer 135 may include, for example, h-BN, where the ferroelectric layer 135 may include a bilayer of h-BN.

In various embodiments, the gate insulating layer 130 and the ferroelectric layer 135 may include h-BN, as a two-dimensional material. However, the stacking structure of the gate insulating layer 130 is different from the stacking structure of the ferroelectric layer 135. That is, the stacking structure of h-BN included in the gate insulating layer 130 is different from the stacking structure of h-BN included in the ferroelectric layer 135.

The h-BN included in the gate insulating layer 130 may have the same stacking structure as shown in FIG. 5 or 6. In the gate insulating layer 130, h-BN in a first layer is vertically overlapping h-BN in a second layer.

In various embodiments, the upper gate conductive layer 125 may be disposed on the ferroelectric layer 135. The upper gate conductive layer 125 may extend along the circumference of the first active pattern AP1, the circumference of the second active pattern AP2, the circumference of the third active pattern AP3, and the upper surface of the substrate 100.

In various embodiments, the upper gate conductive layer 125 may include, for example, a two-dimensional material. The upper gate conductive layer 125 may include, for example, graphene. In the semiconductor device according to various embodiments, the upper gate conductive layer 125 may be a graphene layer.

In various embodiments, the upper gate conductive layer 125 may be in contact with the ferroelectric layer 135. For example, the graphene included in the upper gate conductive layer 125 may be in contact with the ferroelectric layer 135.

In various embodiments, the filling gate conductive layer 127 may be disposed on the upper gate conductive layer 125. The filling gate conductive layer 127 may fill a space between the substrate 100 and the first active pattern AP1, a space between the first active pattern AP1 and the second active pattern AP2, and a space between the second active pattern AP2 and the third active pattern AP3.

In various embodiments, the filling gate conductive layer 127 may include at least one of, for example, a metal, a metal alloy, a conductive metal nitride, a conductive metal carbide, a conductive metal carbonitride, a metal silicide, a doped semiconductor material, a conductive metal oxide, or a conductive metal oxynitride.

In various embodiments, the first source/drain electrode 160 may be disposed on the first active pattern AP1. The first source/drain electrode 160 may be disposed between the first active pattern AP1 and the second channel separation insulating layer 265.

In various embodiments, the first source/drain electrode 160 may overlap the source/drain portion AP1_S of the first active pattern in the third direction D3. The first source/drain electrode 160 does not overlap the channel portion AP1_G of the first active pattern in the third direction D3. The first source/drain electrode 160 is in contact with the first active pattern AP1. The first source/drain electrode 160 is in contact with the source/drain portion AP1_S of the first active pattern.

In various embodiments, the second source/drain electrode 260 may be disposed on the second active pattern AP2. The second source/drain electrode 260 may be disposed between the second active pattern AP2 and the third channel separation insulating layer 365.

In various embodiments, the second source/drain electrode 260 may overlap the source/drain portion AP2_S of the second active pattern in the third direction D3. The second source/drain electrode 260 does not overlap the channel portion AP2_G of the second active pattern in the third direction D3. The second source/drain electrode 260 is in contact with the second active pattern AP2. The second source/drain electrode 260 is in contact with the source/drain portion AP2_S of the second active pattern.

In various embodiments, the third source/drain electrode 360 may be disposed on the third active pattern AP3. The third source/drain electrode 360 may overlap the source/drain portion AP3_S of the third active pattern in the third direction D3. The third source/drain electrode 360 does not overlap the channel portion AP3_G of the third active pattern in the third direction D3.

In various embodiments, the third source/drain electrode 360 is in contact with the third active pattern AP3. The third source/drain electrode 360 is in contact with the source/drain portion AP3_S of the third active pattern.

Referring to FIG. 4, an enlarged view of portion P of FIG. 2, taking the second active pattern AP2 as an example, the second active pattern AP2 may include a first surface AP2_US and a second surface AP2_BS. The first surface AP2_US and the second surface AP2_BS may be opposite to each other in the third direction D3 with a thickness therebetween. The second surface AP2_BS of the second active pattern may face the substrate 100.

In various embodiments, the second source/drain electrode 260 may be disposed on the first surface AP2_US in the source/drain portion AP2_S of the second active pattern. The second source/drain electrode 260 may be in contact with the first surface AP2_US of the second active pattern.

In various embodiments, the second channel separation insulating layer 265 may be disposed on the second surface AP2_BS in the source/drain portion AP2_S of the second active pattern. The second channel separation insulating layer 265 may be in contact with the second surface AP2_BS of the second active pattern AP2.

Referring to FIGS. 1-4, the gate insulating layer 130 may extend along a sidewall of the first source/drain electrode 160, a sidewall of the second source/drain electrode 260, and a sidewall of the third source/drain electrode 360. The gate insulating layer 130 may be in contact with the first source/drain electrode 160, the second source/drain electrode 260, and the third source/drain electrode 360.

The source/drain electrodes 160, 260, and 360 may include at least one of, for example, a metal, a metal alloy, a conductive metal nitride, a conductive metal carbide, a conductive metal carbonitride, a metal silicide, a doped semiconductor material, a conductive metal oxide, or a conductive metal oxynitride.

As shown, for example, in FIG. 2, a first interlayer insulating film 190 may be disposed on the substrate 100. The first interlayer insulating film 190 may cover the source/drain electrodes 160, 260, and 360. A top surface of the first interlayer insulating film 190 may be positioned coplanar with a top surface of the gate structure GS, but the present disclosure is not limited thereto.

The first interlayer insulating film 190 may include at least, for example, silicon oxide, silicon nitride, silicon oxynitride, and/or a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon-doped silicon oxide (CDO), organo silicate glass (OSG), SiLK, amorphous fluorinated carbon, silica aerogels, silica xerogels, mesoporous silica or a combination thereof, but the present disclosure is not limited thereto.

In various embodiments, a second interlayer insulating film 195 may be disposed on the first interlayer insulating film 190. The second interlayer insulating film 195 may cover the top surface of the gate structure GS.

In various embodiments, the second interlayer insulating film 195 may include at least, for example, silicon oxide, silicon nitride, silicon oxynitride, and/or a low-k material.

In various embodiments, a first source/drain contact 180 is disposed on the first source/drain electrode 160. The first source/drain contact 180 may penetrate the first interlayer insulating film 190 and the second interlayer insulating film 195 and be electrically connected to the first source/drain electrode 160.

In various embodiments, the first source/drain contact 180 may be electrically connected to the first active pattern AP1 through the first source/drain electrode 160, where the first source/drain contact 180 is not electrically connected to the second active pattern AP2 and the third active pattern AP3.

In various embodiments, a second source/drain contact 280 is disposed on the second source/drain electrode 260. The second source/drain contact 280 may penetrate the first interlayer insulating film 190 and the second interlayer insulating film 195 and be electrically connected to the second source/drain electrode 260.

In various embodiments, the second source/drain contact 280 may be electrically connected to the second active pattern AP2 through the second source/drain electrode 260. The second source/drain contact 280 is not electrically connected to the first active pattern AP1 and the third active pattern AP3.

In various embodiments, the third source/drain contact 380 is disposed on the third source/drain electrode 360. The third source/drain contact 380 may penetrate through the first interlayer insulating film 190 and the second interlayer insulating film 195 and be electrically connected to the third source/drain electrode 360.

In various embodiments, the third source/drain contact 380 may be electrically connected to the third active pattern AP3 through the third source/drain electrode 360. The third source/drain contact 380 is not electrically connected to the first active pattern AP1 and the second active pattern AP2.

In various embodiments, the source/drain contacts 180, 280, and 380 may include at least one of, for example, a metal, a metal alloy, a conductive metal nitride, a conductive metal carbide, a conductive metal carbonitride, a metal silicide, a doped semiconductor material, a conductive metal oxide, or a conductive metal oxynitride.

In FIG. 5, nitrogen atoms included in the h-BN of the second layer are disposed vertically overlapping nitrogen atoms included in the h-BN of the first layer. Boron atoms included in the h-BN of the second layer are disposed vertically overlapping boron atoms included in the h-BN of the first layer. For example, h-BN included in the gate insulating layer 130 may have an AA stacking structure.

In FIG. 6, nitrogen atoms included in the h-BN of the second layer are disposed vertically overlapping boron atoms included in the h-BN of the first layer. The boron atoms included in the h-BN of the second layer are disposed vertically overlapping the nitrogen atoms included in the h-BN of the first layer. For example, h-BN included in the gate insulating layer 130 may have an AA' stacking structure.

The h-BN included in the ferroelectric layer 135 may have the same stacking structure as shown in FIG. 7 or 8. In the ferroelectric layer 135, h-BN in a first layer is not vertically overlapping h-BN in a second layer.

In FIG. 7, nitrogen atoms included in the h-BN of the second layer are disposed vertically overlapping boron atoms included in the h-BN of the first layer. The boron atoms included in the h-BN of the second layer are not disposed overlapping vertically the nitrogen atoms included in the h-BN of the first layer.

The boron atom included in the h-BN of the second layer is disposed at the center of the hexagonal structure of the h-BN of the first layer. The nitrogen atom included in the h-BN of the first layer is disposed at the center of the hexagonal structure of the h-BN of the second layer. For example, the h-BN included in the ferroelectric layer 135 may have an AB stacking structure. When the h-BN of the second layer is moved to the left or right with respect to the h-BN of the first layer in FIG. 5, a stacking structure of the ferroelectric layer 135 shown in FIG. 7 may be obtained.

In FIG. 8, the boron atoms included in the h-BN of the second layer are disposed vertically overlapping the boron atoms included in the h-BN of the first layer. The nitrogen atoms included in the h-BN of the second layer are not disposed vertically overlapping the nitrogen atoms included in the h-BN of the first layer.

The nitrogen atom included in the h-BN of the second layer is disposed at the center of the hexagonal structure of the h-BN of the first layer. The nitrogen atom included in the h-BN of the first layer is disposed at the center of the hexagonal structure of the h-BN of the second layer. For example, the h-BN included in the ferroelectric layer 135 may have an AB1' stacking structure. When the h-BN of the second layer is moved to the right with respect to the h-BN of the first layer in FIG. 6, a stacking structure of the ferroelectric layer 135 shown in FIG. 8 may be obtained.

Different from FIG. 8, the nitrogen atoms included in the h-BN of the second layer are disposed vertically overlapping the nitrogen atoms included in the h-BN of the first layer. The boron atoms included in the h-BN of the second layer are not disposed overlapping vertically the boron atoms included in the h-BN of the first layer.

The boron atom included in the h-BN of the second layer is disposed at the center of the hexagonal structure of the h-BN of the first layer. The boron atom included in the h-BN of the first layer is disposed at the center of the hexagonal structure of the h-BN of the second layer. For example, the h-BN included in the ferroelectric layer 135 may have an AB2' stacking structure. When the h-BN of the second layer is moved to the left with respect to the h-BN of the first layer in FIG. 6, the stacking structure of the ferroelectric layer 135 described above may be obtained.

Figure 9:
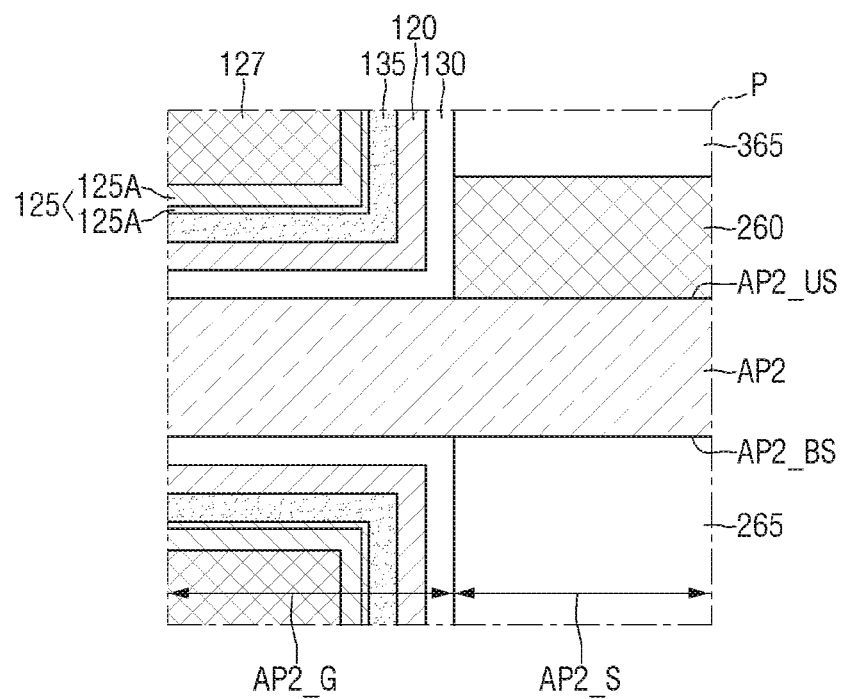
FIG. 9 is an enlarged view describing a semiconductor device of portion P of FIG. 2, according to an embodiment of the present inventive concept.

FIG. 9 is a view for describing a semiconductor device according to various embodiments. For convenience of description, the following description will focus on differences from the semiconductor device described with reference to FIGS. 1 to 8. For reference, FIG. 9 is an enlarged view describing a semiconductor device of portion P of FIG. 2, according to an embodiment of the present inventive concept.

Referring to FIG. 9, in a semiconductor device according to various embodiments, the ferroelectric layer 135 may include $MoS_2$. The ferroelectric layer 135 may include a bilayer of $MoS_2$.

When the active patterns AP1, AP2, and AP3 include $MoS_2$, the active patterns AP1, AP2, and AP3 and the ferroelectric layer 135 may include $MoS_2$, as a two-dimensional material. However, the stacking structures of the active patterns AP1, AP2, and AP3 are different from the stacking structure of the ferroelectric layer 135. That is, the stacking structure of $MoS_2$ included in the active patterns AP1, AP2, and AP3 is different from the stacking structure of $MoS_2$ included in the ferroelectric layer 135.

In various embodiments, the $MoS_2$ included in the active patterns AP1, AP2, and AP3 may have 2H stacking structure having a hexagonal symmetrical structure. For example, the $MoS_2$ included in the active patterns AP1, AP2, and AP3 may have one of the crystallographic point groups D3h and D3d.

In various embodiments, the $MoS_2$ included in the ferroelectric layer 135 may have 3R-stacking structure having a rhombic symmetrical structure. The $MoS_2$ included in the ferroelectric layer 135 may have a non-centrosymmetric point group. For example, the $MoS_2$ included in the ferroelectric layer 135 may have the crystallographic point group C3v.

In various embodiments, the upper gate conductive layer 125 may include a first sub-gate conductive layer 125A and a second sub-gate conductive layer 125B. The first sub-gate conductive layer 125A is disposed between the ferroelectric layer 125 and the second sub-gate conductive layer 125B. The first sub-gate conductive layer 125A may be in contact with the ferroelectric layer 135 and the second sub-gate conductive layer 125B.

In various embodiments, the first sub-gate conductive layer 125A and the second sub-gate conductive layer 125B may include, for example, a two-dimensional material.

In various embodiments, the first sub-gate conductive layer 125A may include, for example, h-BN. More specifically, the first sub-gate conductive layer 125A may include a monolayer of h-BN.

In various embodiments, the second sub-gate conductive layer 125B may include graphene. For example, the second sub-gate conductive layer 125B may be a graphene layer.

Figure 10:
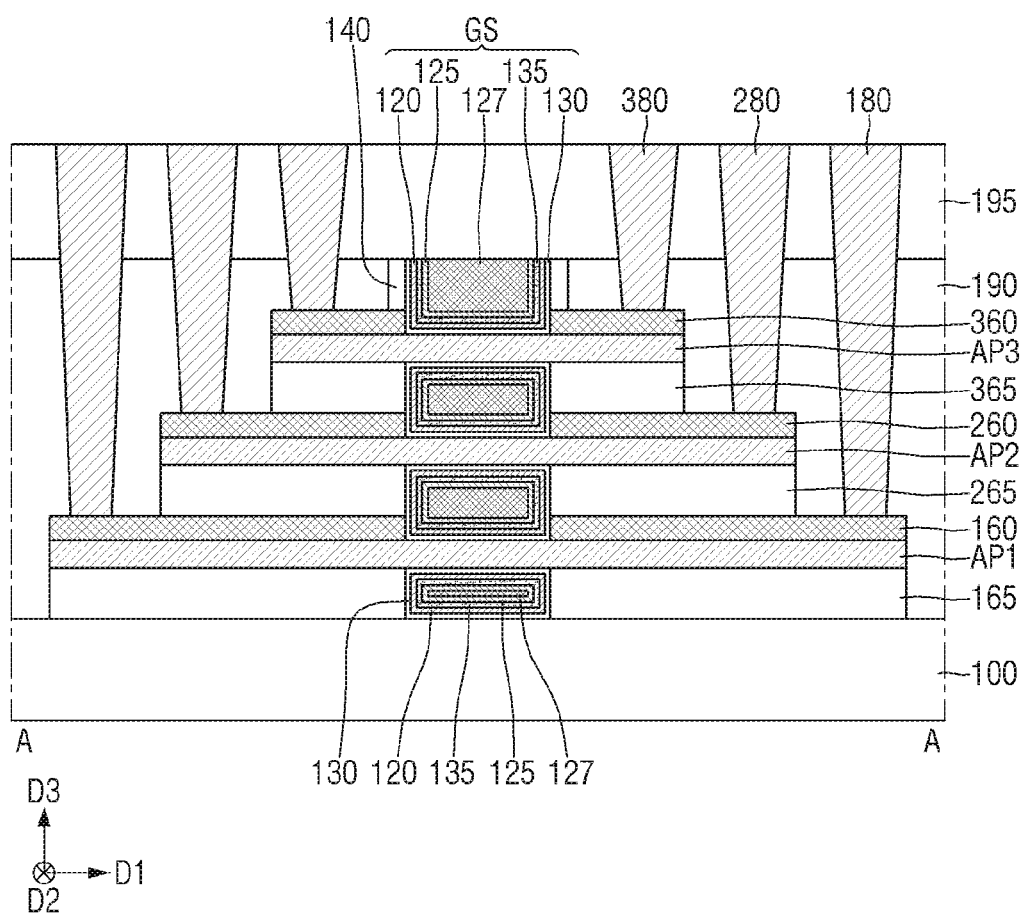
FIG. 10 is a cross-sectional view describing a semiconductor device, according to an embodiment of the present inventive concept.

FIG. 10 is a view for describing a semiconductor device according to various embodiments. For convenience of description, the following description will focus on differences from the semiconductor device described with reference to FIGS. 1 to 8.

Referring to FIG. 10, a semiconductor device according to various embodiments may further include a gate spacer 140 disposed on the sidewall of the gate structure GS.

In various embodiments, the gate spacers 140 may be disposed on the third source/drain electrode 360. A portion of the third source/drain electrode 360 may overlap with the gate spacers 140 in the third direction D3.

In various embodiments, the gate spacers 140 may include at least one of, for example, silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), or a combination thereof.

Figure 11:
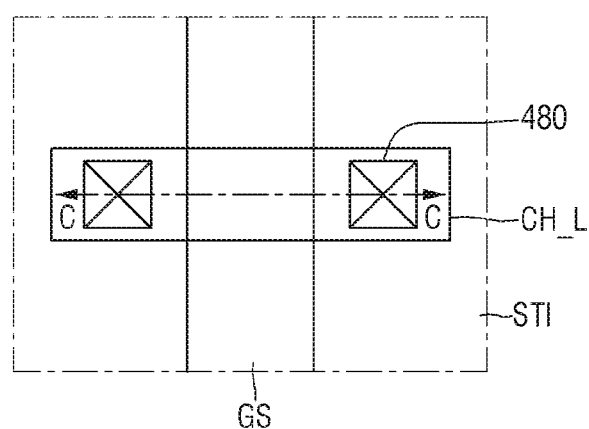
FIG. 11 is a layout diagram for describing a semiconductor device, according to an embodiment of the present inventive concept.
Figure 12:
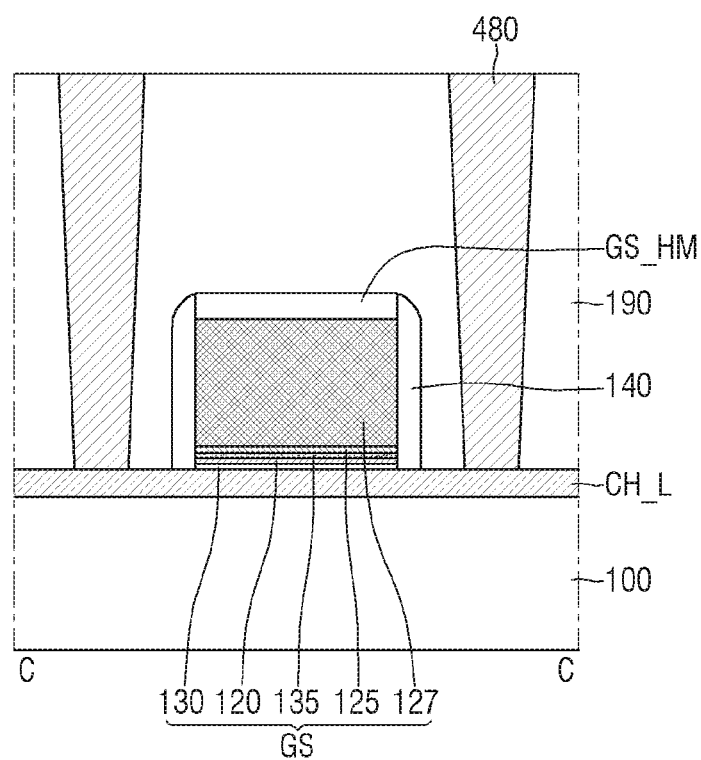
FIG. 12 is a cross-sectional view taken along line C-C of FIG. 11, according to an embodiment of the present inventive concept.

FIG. 11 is a layout diagram for describing a semiconductor device according to various embodiments. FIG. 12 is a cross-sectional view taken along line C-C of FIG. 11. For convenience of description, the following description will focus on differences from the semiconductor device described with reference to FIGS. 1 to 9.

Referring to FIGS. 11 and 12, a semiconductor device according to various embodiments may include a channel layer CH_L, a gate structure GS, and a fourth source/drain contact 480.

In various embodiments, the channel layer CH_L is disposed on the substrate 100. The channel layer CH_L may be disposed in an active region defined by a device isolation film STI.

In various embodiments, the channel layer CH_L may include a two-dimensional semiconductor material. The channel layer CH_L may include at least one of, for example, $MoS_2$, $MoSe_2$, $MoTe_2$, $WS_2$, $WSe_2$, or, $WTe_2$, but the present disclosure is not limited thereto. In the semiconductor device according to various embodiments, the channel layer CH_L may include $MoS_2$.

For example, the device isolation film STI may be disposed around the channel layer CH_L. The device isolation film STI may include, for example, an oxide film, a nitride film, an oxynitride film, or a combination thereof.

In various embodiments, the gate structure GS may be disposed on the channel layer CH_L. The gate structure GS may be disposed over the channel layer CH_L and the device isolation film STI.

In various embodiments, the gate structure GS may include a gate insulating layer 130, a lower gate conductive layer 120, a ferroelectric layer 135, and an upper gate conductive layer 125, which are sequentially stacked on the channel layer CH_L. The gate structure GS may further include a filling gate conductive layer 127, which is stacked on the upper gate conductive layer 125.

In various embodiments, the gate insulating layer 130 is disposed on the channel layer CH_L. The gate insulating layer 130 may be in contact with the channel layer CH_L.

In various embodiments, the lower gate conductive layer 120 may be in contact with the gate insulating layer 130. The lower gate conductive layer 120 may include graphene. For example, the lower gate conductive layer 120 may be a graphene layer.

Descriptions of the materials included in the lower gate conductive layer 120 and the filling gate conductive layer 127 may be substantially the same as the descriptions made with reference to FIGS. 1 to 9.

In a non-limiting example, the ferroelectric layer 135 may include a bilayer of h-BN. The upper gate conductive layer 125 may include graphene disposed on the ferroelectric layer 135. The upper gate conductive layer 125 may include graphene. The upper gate conductive layer 125 may be a graphene layer. The upper gate conductive layer 125 is in contact with the ferroelectric layer 135.

In another non-limiting example, the ferroelectric layer 135 may include a bilayer of $MoS_2$, where the stacking structure of $MoS_2$ included in the channel layer CH_L is different from the stacking structure of $MoS_2$ included in the ferroelectric layer 135.

In various embodiments, the upper gate conductive layer 125 may include an upper gate graphene layer including graphene. The upper gate conductive layer 125 may include an injection gate layer disposed between the upper gate graphene layer and the ferroelectric layer. The injection gate layer may include a monolayer of h-BN. The injection gate layer may be in contact with the ferroelectric layer 135.

In various embodiments, the filling gate conductive layer 127 may be disposed on the upper gate conductive layer 125.

In various embodiments, a gate hard mask pattern GS_HM is disposed on the upper surface of the gate structure GS. The gate hard mask pattern GS_HM is disposed on the upper gate conductive layer 125. The gate hard mask pattern GS_HM may include at least one of, for example, silicon nitride (SiN), silicon oxynitride (SiON), or silicon oxide ($SiO_2$).

The gate spacer 140 is disposed on the channel layer CH_L. The gate spacer 140 may be disposed on the sidewall of the gate structure GS. The gate insulating layer 130 does not extend along the sidewall of the gate spacer 140.

The first interlayer insulating film 190 is disposed on the channel layer CH_L. The first interlayer insulating film 190 is disposed on the gate hard mask pattern GS_HM.

The fourth source/drain contact 480 is disposed on the channel layer CH_L. The fourth source/drain contact 480 may be disposed on both sides of the gate structure GS. The fourth source/drain contact 480 may penetrate through the first interlayer insulating film 190 and be connected to the channel layer CH_L.

Figure 13:
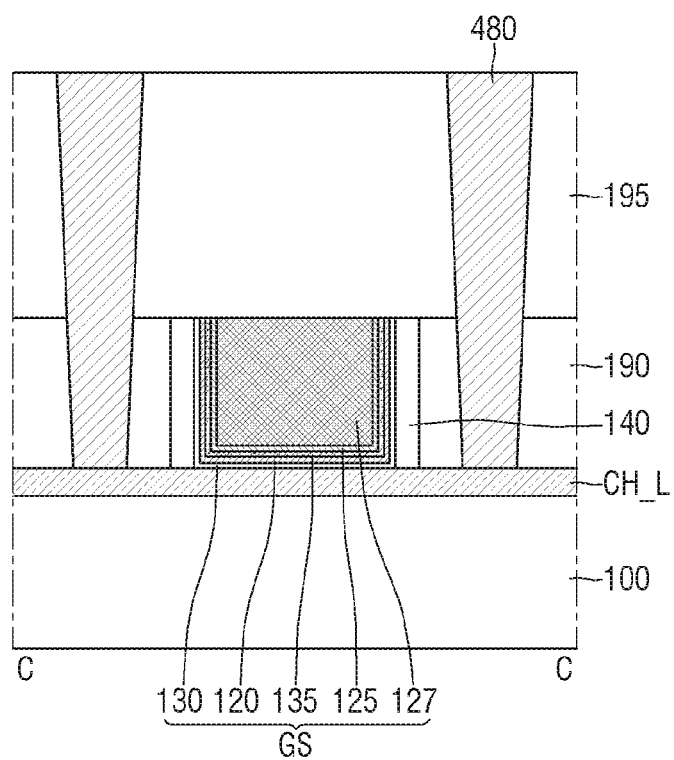
FIG. 13 is a cross-sectional view for describing a semiconductor device, according to an embodiment of the present inventive concept.

FIG. 13 is a view for describing a semiconductor device according to various embodiments. For convenience of description, the following description will focus on differences from the semiconductor device described with reference to FIGS. 11 and 12.

Referring to FIG. 13, in a semiconductor device according to various embodiments, the gate insulating layer 130, the lower gate conductive layer 120, the ferroelectric layer 135, and the upper gate conductive layer 125 may each extend along the upper surface of the channel layer CH_L and the sidewall of the gate spacer 140.

In various embodiments, the filling gate conductive layer 127 may be filled in a recess defined by the upper gate conductive layer 125.

In various embodiments, the upper surface of the gate structure GS may be positioned coplanar with an upper surface of the first interlayer insulating film 190.

Although not illustrated, a gate capping pattern may be disposed on the filling gate conductive layer 127. In this case, an upper surface of the gate capping pattern may be positioned coplanar with the upper surface of the first interlayer insulating film 190.

In various embodiments, the second interlayer insulating film 195 is disposed on the first interlayer insulating film 190, the gate structure GS, and the gate spacers 140.

In various embodiments, the fourth source/drain contact 480 may penetrate through the first interlayer insulating film 190 and the second interlayer insulating film 195 and be electrically connected to the channel layer CH_L.

FIGS. 14 to 19 are views illustrating intermediate stages of fabrication, provided to explain a method of fabricating a semiconductor device, according to various embodiments.

For reference, FIGS. 14, 16, 18, and 19 may be cross-sectional views taken along line A-A of FIG. 1. FIGS. 15 and 17 may be cross-sectional views taken along line B-B of FIG. 1.

Figure 14:
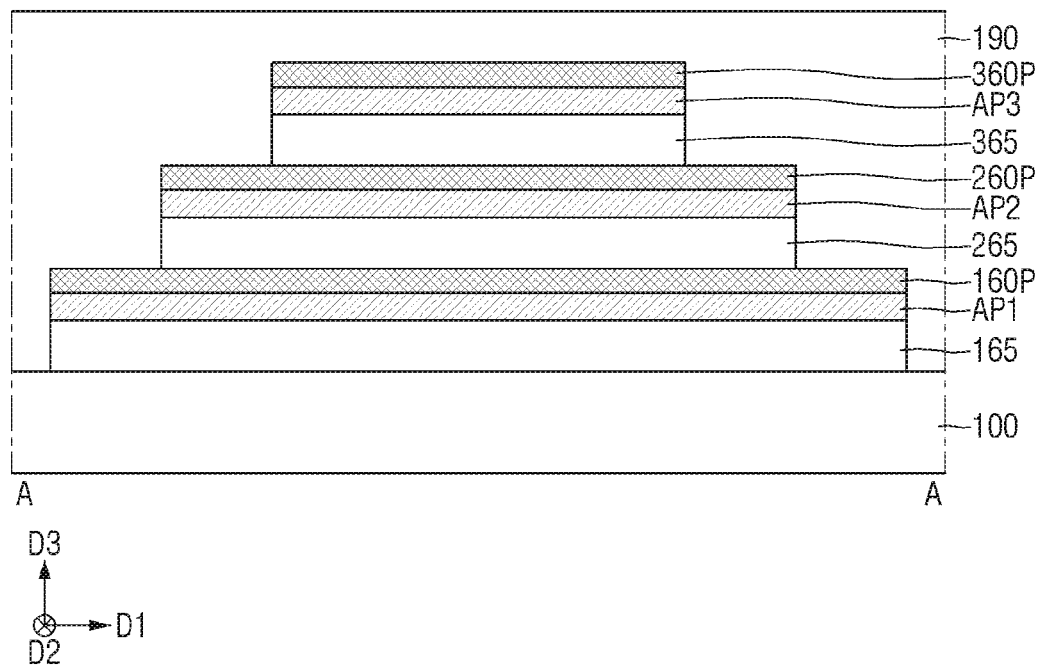
FIGS. 14 to 19 are cross-sectional views illustrating intermediate stages of fabrication, provided to explain a method of fabricating a semiconductor device, according to an embodiment of the present inventive concept.
Figure 15:
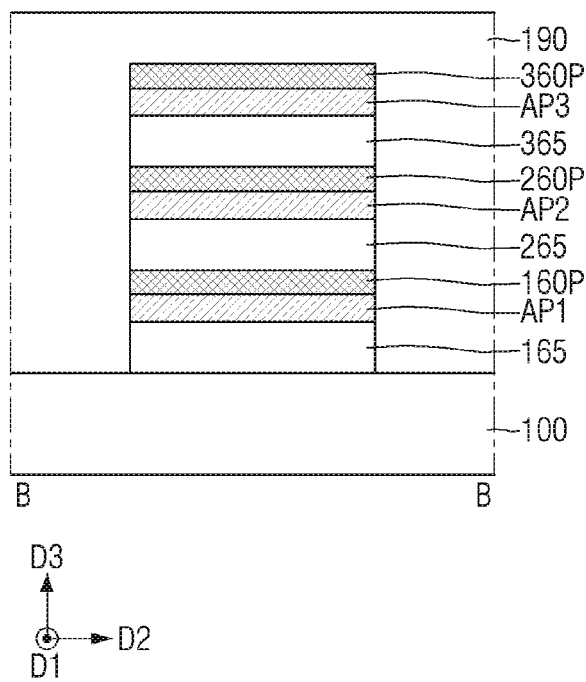

Referring to FIGS. 14 and 15, a first active pattern AP1, a second active pattern AP2, and a third active pattern AP3 can be formed on a substrate 100.

More specifically, a mold structure can be formed on the substrate 100. The mold structure may include a plurality of mold unit structures. The mold unit structure may include a separation insulating film, an active film, and an electrode film, which are sequentially stacked on the substrate 100.

In various embodiments, a photo process may be performed to create a staircase structure of the mold structure. Thereafter, the mold structure with a staircase structure may be patterned using an etching process. As a result, the first active pattern AP1, the second active pattern AP2, and the third active pattern AP2 may be formed to have a staircase structure.

During the formation of the first active pattern AP1, the second active pattern AP2, and the third active pattern AP3, a first channel separation insulating layer 165 can be formed between the substrate 100 and the first active pattern AP1. A second channel separation insulating layer 265 can be formed between the first active pattern AP1 and the second active pattern AP2. A third channel separation insulating layer 365 can be formed between the second active pattern AP2 and the third active pattern AP3.

In various embodiments, during the formation of the first active pattern AP1, the second active pattern AP2, and the third active pattern AP3, a first pre-source/drain electrode 160P is formed between the first active pattern AP1 and the second channel separation insulating layer 265. The second pre-source/drain electrode 260P is formed between the second active pattern AP2 and the third channel separation insulating layer 365. A third pre-source/drain electrode 360P is formed on the third active pattern AP3.

In various embodiments, the first interlayer insulating film 190 may be formed on the first active pattern AP1, the second active pattern AP2, and the third active pattern AP3.

Figure 16:
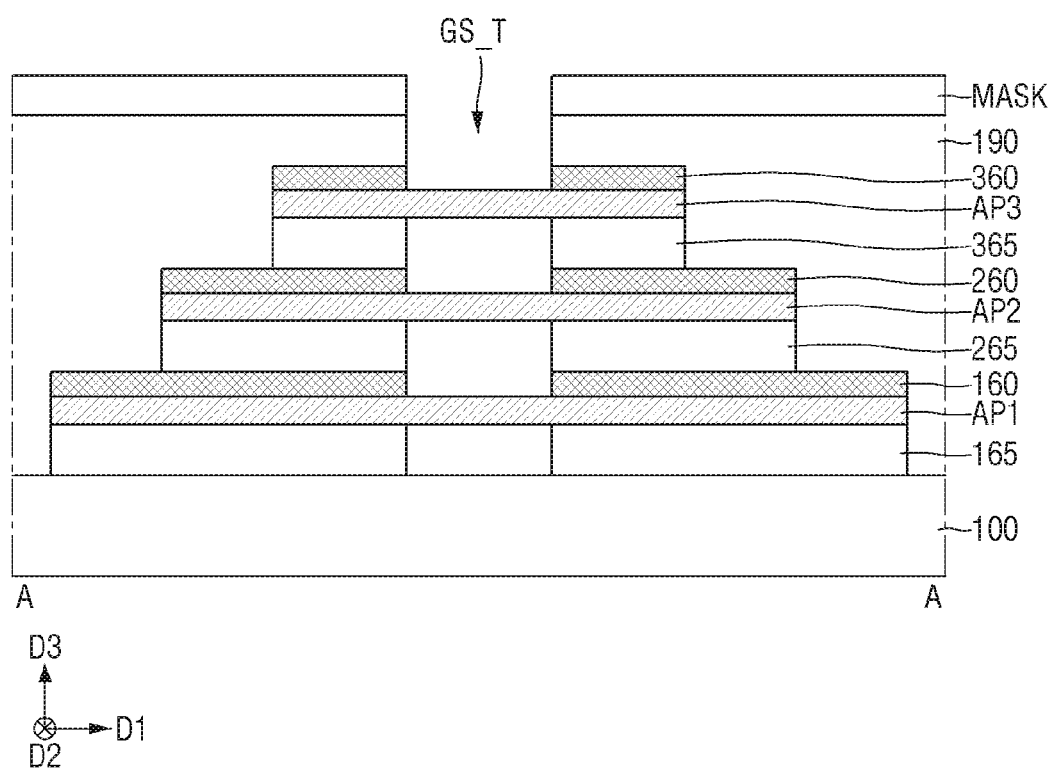
Figure 17:
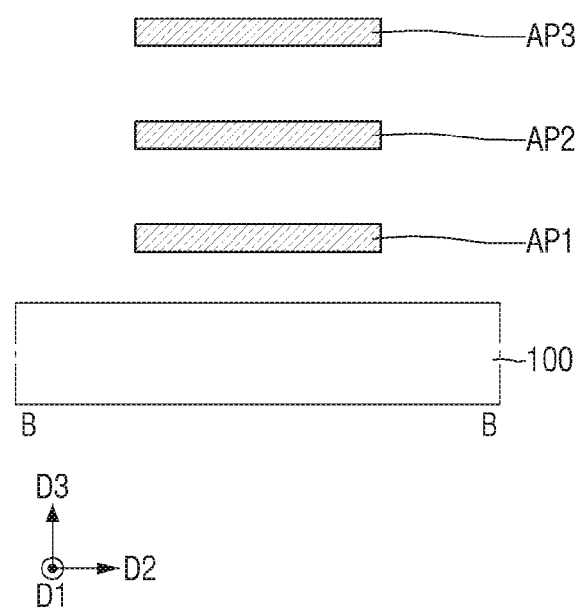

Referring to FIGS. 16 and 17, a mask pattern MASK may be formed on the first interlayer insulating film 190.

In various embodiments, a gate trench GS_T may be formed using the mask pattern MASK. The channel separation insulating layers 165, 265, and 365 exposed by the mask pattern MASK may be removed. In addition, the pre-source/drain electrodes 160P, 260P, and 360P (shown in FIGS. 14 and 15) exposed by the mask pattern MASK may be removed. During the formation of the gate trench GS_T, the pre-source/drain electrodes 160P, 260P, and 360P may be partially removed to form source/drain electrodes 160, 260, and 360, respectively.

Figure 18:
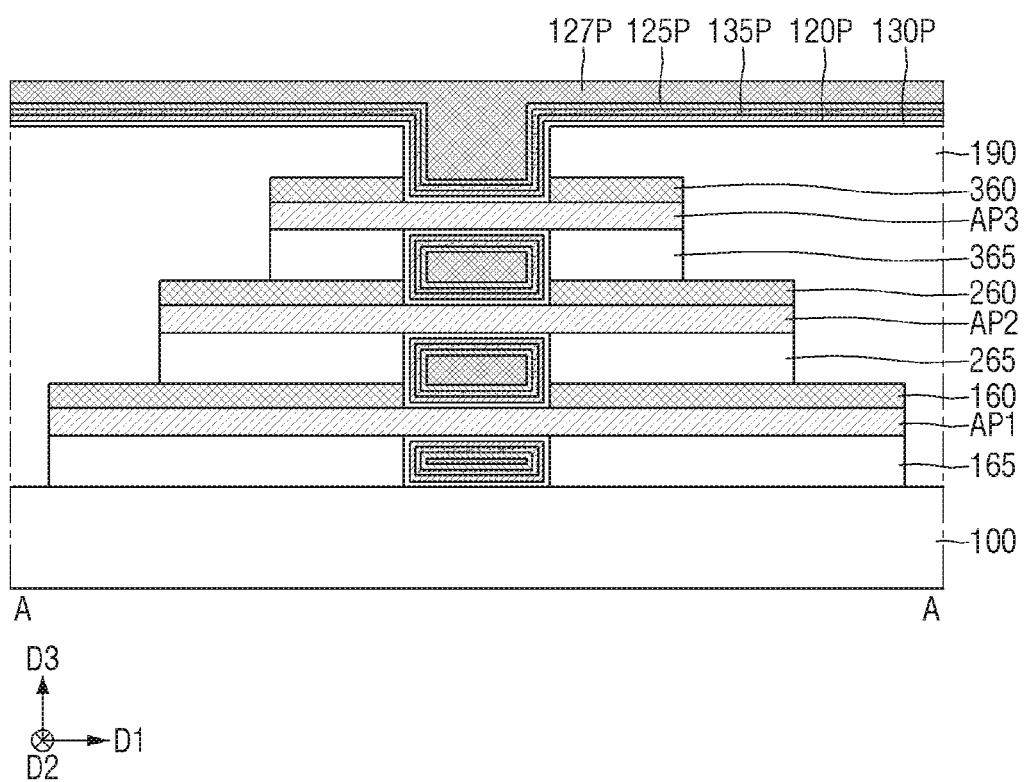

Referring to FIG. 18, a pre-gate insulating layer 130P, a pre-lower gate conductive layer 120P, a pre-ferroelectric layer 135P, and a pre-upper gate conductive layer 125P may be sequentially formed along the edges of the active patterns AP1, AP2, and AP3.

For example, the pre-gate insulating layer 130P, the pre-lower gate conductive layer 120P, the pre-ferroelectric layer 135P, and the pre-upper gate conductive layer 125P may be transferred onto the active patterns AP1, AP2, and AP3.

In various embodiments, the pre-gate insulating layer 130P, the pre-lower gate conductive layer 120P, the pre-ferroelectric layer 135P, and the pre-upper gate conductive layer 125P may be formed along a sidewall and a bottom surface of the gate trench GS_T. The pre-gate insulating layer 130P, the pre-lower gate conductive layer 120P, the pre-ferroelectric layer 135P, and the pre-upper gate conductive layer 125P may be formed along a top surface of the first interlayer insulating film 190.

In various embodiments, a pre-filling gate conductive layer 127P is formed on the pre-upper gate conductive layer 125P. The pre-filling gate conductive layer 127P may be filled in the gate trench GS_T. The pre-filling gate conductive layer 127P may be formed on the top surface of the first interlayer insulating film 190.

Figure 19:
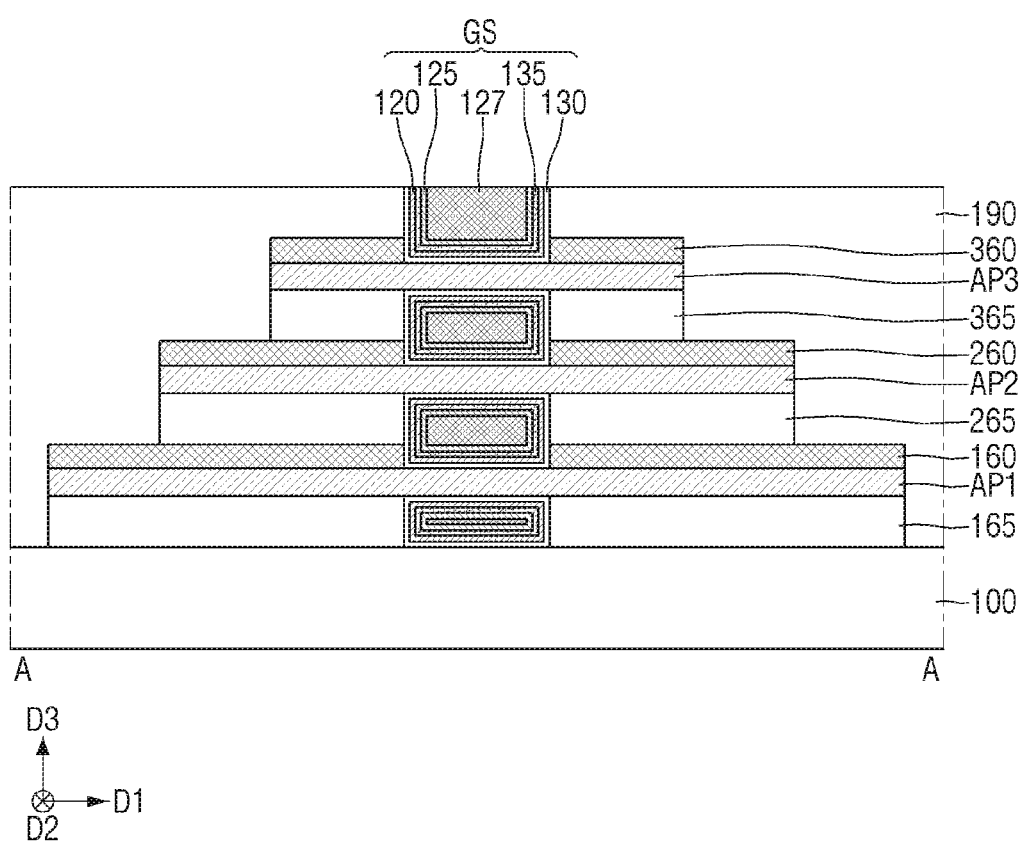

Referring to FIGS. 18 and 19, the pre-gate insulating layer 130P, the pre-lower gate conductive layer 120P, the pre-ferroelectric layer 135P, the pre-upper gate conductive layer 125P, and the pre-filling gate conductive layer 127P may be removed from the first interlayer insulating film 190.

As a result, the gate structure GS may be formed within the gate trench GS_T.

Thereafter, referring to FIG. 2, the second interlayer insulating film 195 may be formed on the first interlayer insulating film 190 and the gate structure GS. In various embodiments, the source/drain contacts 180, 280, and 380 may subsequently be formed.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device comprising:
a substrate;
a gate structure disposed on the substrate and extending in a first direction; and
an active pattern spaced apart from the substrate in a second direction, extending in a third direction, and penetrating the gate structure,
wherein the active pattern includes a two-dimensional material,
the gate structure comprises a gate insulating layer, a lower gate conductive layer, a ferroelectric layer, and an upper gate conductive layer, which are sequentially stacked on the active pattern,
the gate insulating layer includes hexagonal boron nitride (h-BN), and
the ferroelectric layer includes a bilayer of a two-dimensional material.

2. The semiconductor device of claim 1, wherein the ferroelectric layer includes h-BN.

3. The semiconductor device of claim 2, wherein a stacking structure of the ferroelectric layer is different from a stacking structure of the gate insulating layer.

4. The semiconductor device of claim 2, wherein both the lower gate conductive layer and the upper gate conductive layer include graphene, and the graphene included in the upper gate conductive layer is in contact with the ferroelectric layer.

5. The semiconductor device of claim 1, wherein the ferroelectric layer includes $MoS_2$.

6. The semiconductor device of claim 5, wherein the upper gate conductive layer comprises a first sub-gate conductive layer and a second sub-gate conductive layer that are sequentially stacked on the ferroelectric layer,
both the lower gate conductive layer and the second sub-gate conductive layer include graphene, and
the first sub-gate conductive layer includes a monolayer of h-BN.

7. The semiconductor device of claim 5, wherein the active pattern includes $MoS_2$, and
a stacking structure of the ferroelectric layer is different from a stacking structure of the active pattern.

8. The semiconductor device of claim 7, wherein the ferroelectric layer has point group C3v, and
the active pattern has one of point groups D3h and D3d.

9. The semiconductor device of claim 1, wherein both the lower gate conductive layer and the upper gate conductive layer include a two-dimensional material.

10. The semiconductor device of claim 1, further comprising a source/drain electrode on the active pattern,
wherein the active pattern comprises a channel portion that overlaps with the gate structure in the second direction and a source/drain portion that protrudes from the channel portion in the third direction, and
the source/drain electrode is in electrical contact with the source/drain portion of the active pattern.

11. The semiconductor device of claim 10, further comprising a channel separation insulating layer in contact with the active pattern,
wherein the active pattern comprises a first surface and a second surface opposite to the first surface in the second direction,
the source/drain electrode is disposed on the first surface, and
the channel separation insulating layer is disposed on the second surface in the source/drain portion of the active pattern.

12. The semiconductor device of claim 10, wherein the gate insulating layer is in contact with the source/drain electrode.

13. A semiconductor device comprising:
a channel layer disposed on a substrate and including a two-dimensional material;
a gate structure disposed on the channel layer; and
source/drain contacts disposed on both sides of the gate structure and electrically connected to the channel layer,
wherein the gate structure comprises
a gate insulating layer including hexagonal boron nitride (h-BN),
a lower gate graphene layer disposed on the gate insulating layer and including graphene,
a ferroelectric layer disposed on the lower gate graphene layer and including a bilayer of a two-dimensional material, and
an upper gate graphene layer disposed on the ferroelectric layer and including graphene.

14. The semiconductor device of claim 13, wherein the ferroelectric layer includes h-BN.

15. The semiconductor device of claim 14, wherein the upper gate graphene layer is in contact with the ferroelectric layer.

16. The semiconductor device of claim 13, wherein both the channel layer and the ferroelectric layer include $MoS_2$, and a stacking structure of the ferroelectric layer is different from a stacking structure of the active pattern.

17. The semiconductor device of claim 16, wherein the gate structure further comprises an injection gate layer disposed between the ferroelectric layer and the upper gate graphene layer, and the injection gate layer includes a monolayer of h-BN.

18. A semiconductor device comprising:

a substrate;

a gate structure disposed on the substrate and extending in a first direction;

a first active pattern spaced apart from the substrate in a second direction, extending in a third direction, and penetrating the gate structure;

a second active pattern disposed on the first active pattern, spaced apart from the first active pattern in the second direction, extending in the third direction, and penetrating the gate structure, a length of the second active pattern in the third direction being smaller than a length of the first active pattern in the third direction;

a first source/drain contact electrically connected to the first active pattern and not electrically connected to the second active pattern; and a second source/drain contact electrically connected to the second active pattern and not electrically connected to the first active pattern, wherein the first active pattern and the second active pattern include a two-dimensional material, the gate structure comprises a gate insulating layer extending along a circumference of the first active pattern and a circumference of the second active pattern and including hexagonal boron nitride(h-BN), a lower gate graphene layer disposed on the gate insulating layer, extending along the circumference of the first active pattern and the circumference of the second active pattern, and including graphene, a ferroelectric layer disposed on the lower gate graphene layer, extending along the circumference of the first active pattern and the circumference of the second active pattern, and including a bilayer of a two-dimensional material, an upper gate conductive layer disposed on the ferroelectric layer and extending along the circumference of the first active pattern and the circumference of the second active pattern, and a filling gate conductive layer disposed on the upper gate conductive layer.

19. The semiconductor device of claim 18, wherein the ferroelectric layer includes h-BN, and the upper gate conductive layer is in contact with the ferroelectric layer and made of graphene.

20. The semiconductor device of claim 18, wherein the ferroelectric layer includes $MoS_2$, the upper gate conductive layer comprises a first sub-gate conductive layer in contact with the ferroelectric layer, and a second sub-gate conductive layer on the first sub-gate conductive layer, the first sub-gate conductive layer includes a monolayer of h-BN, and the second sub-gate conductive layer is made of graphene.

* * * * *